(12) United States Patent  
Kurosaki

(10) Patent No.: US 6,373,750 B2
(45) Date of Patent: Apr. 16, 2002

(54) NON-VOLATILE MEMORY WHICH PERFORMS ERASURE IN A SHORT TIME

(75) Inventor: Kazuhide Kurosaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/726,566

(22) Filed: Dec. 1, 2000

(30) Foreign Application Priority Data

Feb. 1, 2000 (JP) ........................................ 2000-023807

(51) Int. Cl.$^7$ ................................................ G11C 7/00
(52) U.S. Cl. .......................... 365/185.29; 365/185.01; 365/185.3; 365/185.22; 365/185.18
(58) Field of Search ........................ 365/185.01, 185.22, 365/185.3, 185.18, 185.29, 185.24

(56) References Cited

U.S. PATENT DOCUMENTS

| | | | | | |
|---|---|---|---|---|---|
| 5,384,743 A | * | 1/1995 | Rouy | .......................... | 365/218 |
| 5,734,816 A | * | 3/1998 | Nijima et al. | .......... | 395/182.06 |
| 5,949,716 A | * | 9/1999 | Wong et al. | ............ | 365/185.29 |
| 5,963,479 A | * | 10/1999 | Park et al. | ............. | 365/185.29 |
| 6,172,915 B1 | * | 1/2001 | Tang et al. | ............ | 365/185.29 |
| 6,222,772 B1 | * | 4/2001 | Choi et al. | ............. | 365/185.22 |

FOREIGN PATENT DOCUMENTS

| | | | | |
|---|---|---|---|---|
| JP | A-10-83683 | | | 3/1998 |
| JP | 410199271 A | * | | 7/1998 |
| JP | A-11-144482 | | | 5/1999 |

* cited by examiner

Primary Examiner—Viet Q. Nguyen
(74) Attorney, Agent, or Firm—Arent Fox Kintner Plotkin & Kahn, PLLC

(57) ABSTRACT

The present invention is a flash memory, wherein when erasing a plurality of sectors an erasure process of applying a normal erasure stress to one sector is performed, while at the same time, a pre-erasure process of applying a pre-erasure stress, that is weaker than the normal erasure stress, to the other sectors to be erased is performed. By performing a pre-erasure process to the other sectors while the normal erasure process is being performed, it is possible to shorten the following erasure processing for the other sectors.

11 Claims, 7 Drawing Sheets

FIG. 3

| Case | E F | P E F | S E L | Source Line Voltage A R V S |
|---|---|---|---|---|
| 1 | 1 | 1 | 1 | While E R = 1   V S S |
| 2 | 1 | 1 | 0 | While E R = 1   V C C |
| 3 | 1 | 0 | 1 | While E R = 1   V P S |
| 4 | 1 | 0 | 0 | While E R = 1   V S S |
| 5 | 0 | 1 | 1 | While E R = 1   V S S |
| 6 | 0 | 1 | 0 | While E R = 1   V C C |
| 7 | 0 | 0 | 1 | While E R = 1   V P S |
| 8 | 0 | 0 | 0 | While E R = 1   V S S |

Erase State

Program State

Erase Operation

Self-convergence Operation

FIG. 7

Flag Register

|      | a | b | c | d | ... | e | f | ... | g | ... | h |
|------|---|---|---|---|-----|---|---|-----|---|-----|---|
| EF0  | 1 | 1 | 1 | 1 |     | 0 | 0 |     | 0 |     | 0 |
| PEF0 | 1 | 0 | 0 | 0 |     | 0 | 0 |     | 0 |     | 0 |
| SEL0 | 1 | 1 | 0 | 0 |     | 0 | 0 |     | 0 |     | 0 |
| EF1  | 1 | 1 | 1 | 1 |     | 1 | 1 |     | 0 |     | 0 |
| PEF1 | 1 | 1 | 1 | 1 |     | 1 | 0 |     | 0 |     | 0 |
| SEL1 | 0 | 0 | 1 | 0 |     | 0 | 1 |     | 0 |     | 0 |
| EF2  | 1 | 1 | 1 | 1 |     | 1 | 1 |     | 1 |     | 0 |
| PEF2 | 1 | 1 | 1 | 1 |     | 0 | 0 |     | 0 |     | 0 |
| SEL2 | 0 | 0 | 0 | 1 |     | 0 | 0 |     | 1 |     | 0 |

NON-VOLATILE MEMORY WHICH PERFORMS ERASURE IN A SHORT TIME

BACKGROUND OF THE INVENTION

1. Field of the Invention

This invention relates to a non-volatile memory (EEPROM) such as a flash memory that is capable of being electrically rewritten, and in particular to a non-volatile memory that is capable of erasing a plurality of sectors in a short time.

2. Related Art

A flash memory has non-volatile memory cells that have floating gates. A flash memory comprises a plurality of a sectors each of which has a plurality of memory cells, and the memory is erased (deleted) in sector units and programmed (written) for each memory cell.

FIG. 1 is a figure for explaining the erasure operation for a prior non-volatile memory. FIG. 1 shows a cross section of a non-volatile memory cell. This memory cell is formed from an N-type drain 2 and source 3 inside the P-type well area 4 of an N-type silicon semiconductor substrate 1, and comprises a floating gate FG and control gate CG on the channel area. Also, the drain 2 is connected to a bit line BL, and the control gate CG is connected to a word line WL (or jointly used). In addition, the source 3 is connected to a source line SL.

For the memory cell, the erasure state (data 1) is the state when the threshold voltage of the cell transistor is low without electrons entering the floating gate FG, and the program state (data 0) is the state when electrons enter the floating gate FG and the threshold voltage of the cell transistor is high.

In order to erase a memory cell that is in the program state, a negative voltage (for example −9V) is applied to the control gate CG from the word line WL, the bit line BL is caused to be open, and a step-up voltage VPS is applied to the source 3 from the source line SL, so that a large pulse voltage is applied in the direction from the source 3 to the floating gate FG and the electrons in the floating gage FG are removed to the source side, or it is also possible to draw electrons to the P-well area 4 by making the P-type well area 4, a channel of cell, the same potential as the source 3. These are called erasure pulse or erasure stress. The step-up voltage VPS is a higher voltage than the power-supply VCC, and is generally generated by a step-up voltage circuit 12 that is provided internally. However, the current-supply capability of this step-up voltage circuit 12 is limited.

The flash memory comprises a plurality of sectors, and the aforementioned erasure operation is performed for each sector. In this case, even in case of erasing a plurality of sectors, the erasure operation is not performed for the plurality of sectors at the same time, but is performed one sector at a time. The reasons for this are, first, when erasing a sector, it is necessary to apply the step-up voltage VPS to all of the cell sources 3 (or channel or well 4) in a sector, however, since the electrons that have built up in the floating gate FG are drawn out to the source, a relatively large current flows to the source 3. However, since the step-up voltage circuit 12 generates a higher step-up voltage by a pumping operation from the power-supply voltage, the current-supply capability is limited as mentioned above. Therefore, it is not possible to apply the step-up voltage VSP simultaneously to all of memory cells in the plural sectors. Second, when an erasure stress is applied to all of the sectors at the same time, there is the problem that some cells will be over erased due to variation in cell characteristics, and the threshold voltage becomes negative. For the over erased cells, self convergence, or recovery process, is performed by a light program operation for returning the threshold voltage to a positive voltage. However, in order to decrease the erasure time, it is necessary to reduce this self-convergence operation as much as possible, and should be avoid when possible.

Recently, with the increase in capacity of flash memory, the number of sectors has increased and the number of processes for erasing more sectors has increased. This has resulted in the problem that the erasure time has become longer.

SUMMARY OF THE INVENTION

The objective of this invention is to provide a non-volatile memory that is capable of reducing the erasure processing time when erasing a plurality of sectors.

In order to accomplish the aforementioned objective, a first aspect of the present invention is a flash memory, wherein when erasing a plurality of sectors an erasure process of applying a normal erasure stress to one sector is performed, while at the same time, a pre-erasure process of applying a pre-erasure stress, that is weaker than the normal erasure stress, to the other sectors to be erased is performed. By performing a pre-erasure process to the other sectors while the normal erasure process is being performed, it is possible to shorten the following erasure processing for the other sectors.

In order to accomplish the aforementioned objective, according to a second aspect of the invention, when erasing a plurality of sectors of a flash memory, a normal erasure process of applying a step-up voltage to the cell source or channel is performed, while at the same time, a pre-erasure process of applying a power-supply voltage, that is lower than the step-up voltage applied cell source or channel, to other sectors to be erased is performed.

By performing pre-erasure processing for other sectors to be erased while performing normal erasure processing of a sector to be erased, it is not possible to apply an erasure stress that is as strong as the step-up voltage used in normal erasure processing, however, it is possible to apply an erasure stress weaker than that. Though not complete, an erasure procedure is performed for the other sectors to be erased, and this makes it possible to reduce the time for performing normal erasure processing for the other sectors later.

In a third aspect of the present invention, when performing erasure processing for a sector to be erased while at the same time performing pre-erasure processing for other sectors to be erased, according to the present invention described above, an over erasure verification is performed for other sectors to be erased, and over erased sectors have been detected, the pre-erasure processing is not performed anymore for the other sectors in which an over erasure is detected.

Since the pre-erasure processing is performed at the same time as the erasure processing of a sector to be erased, there is a possibility that cells of other sectors to be erased are over erased. When that happens, the pre-erasure processing is prohibited for other sectors to be erased that have been over erased, and an erasure verification and an over erasure verification are performed in the normal erasure processing which is performed after that. In this way, it is possible to reduce the necessity of unneeded recovery processing, and thus it is possible to shorten the overall erasure process.

BRIEF DESCRIPTION OF THE DRAWINGS

FIG. 3 is a drawing showing a logical table for the source-line voltage generation circuit.

FIG. 7 is a table showing the change of the erasure sector flag EF, pre-erasure sector flag PEF and sector selection signal SEL in the flag register.

DESCRIPTION OF THE PREFERRED EMBODIMENTS

The preferred embodiments of the invention will be described below with reference to the drawings. However, these embodiments do not limit the technical range of the invention.

Figure 1:
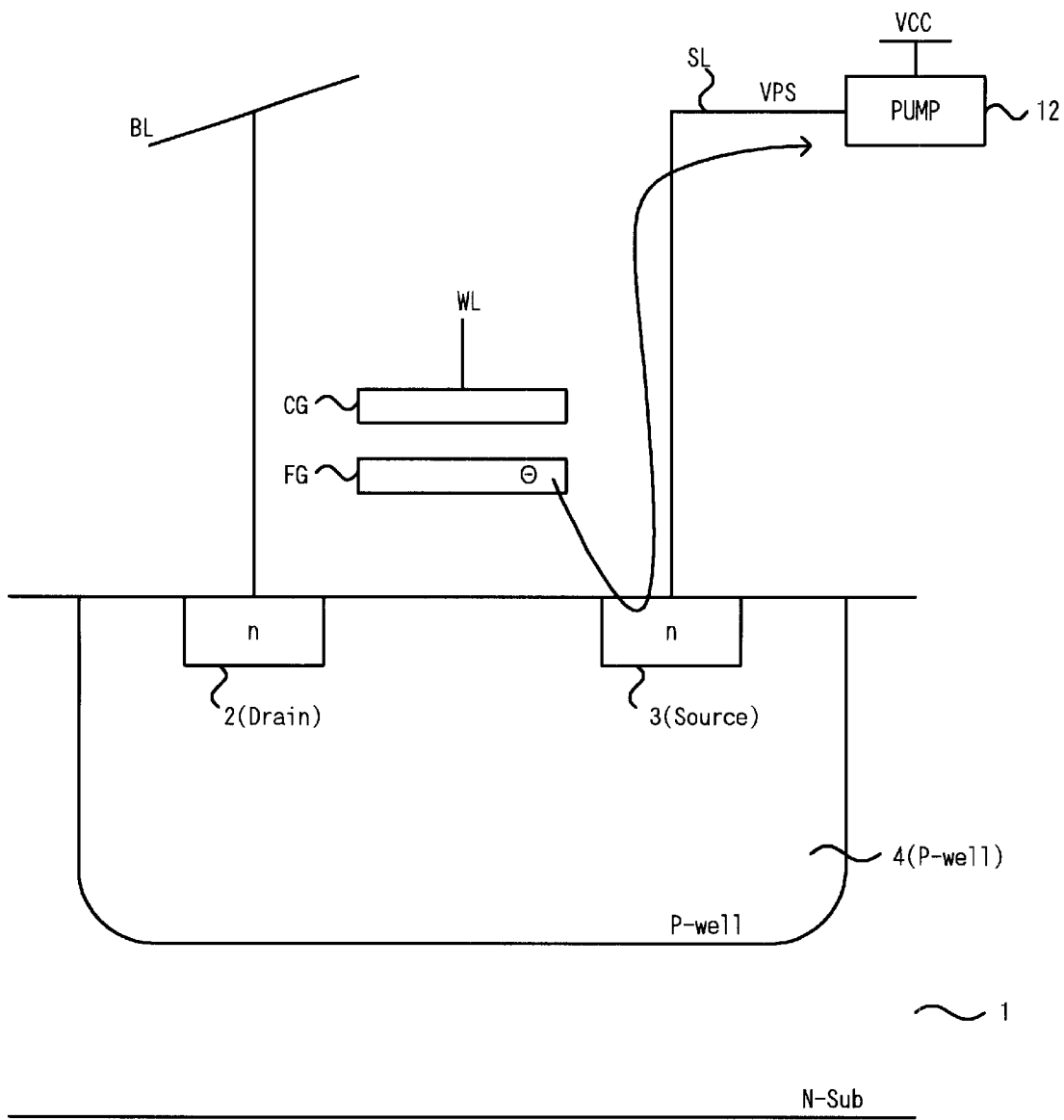
FIG. 1 is a drawing explaining the erasure operation in a prior non-volatile memory.
Figure 2:
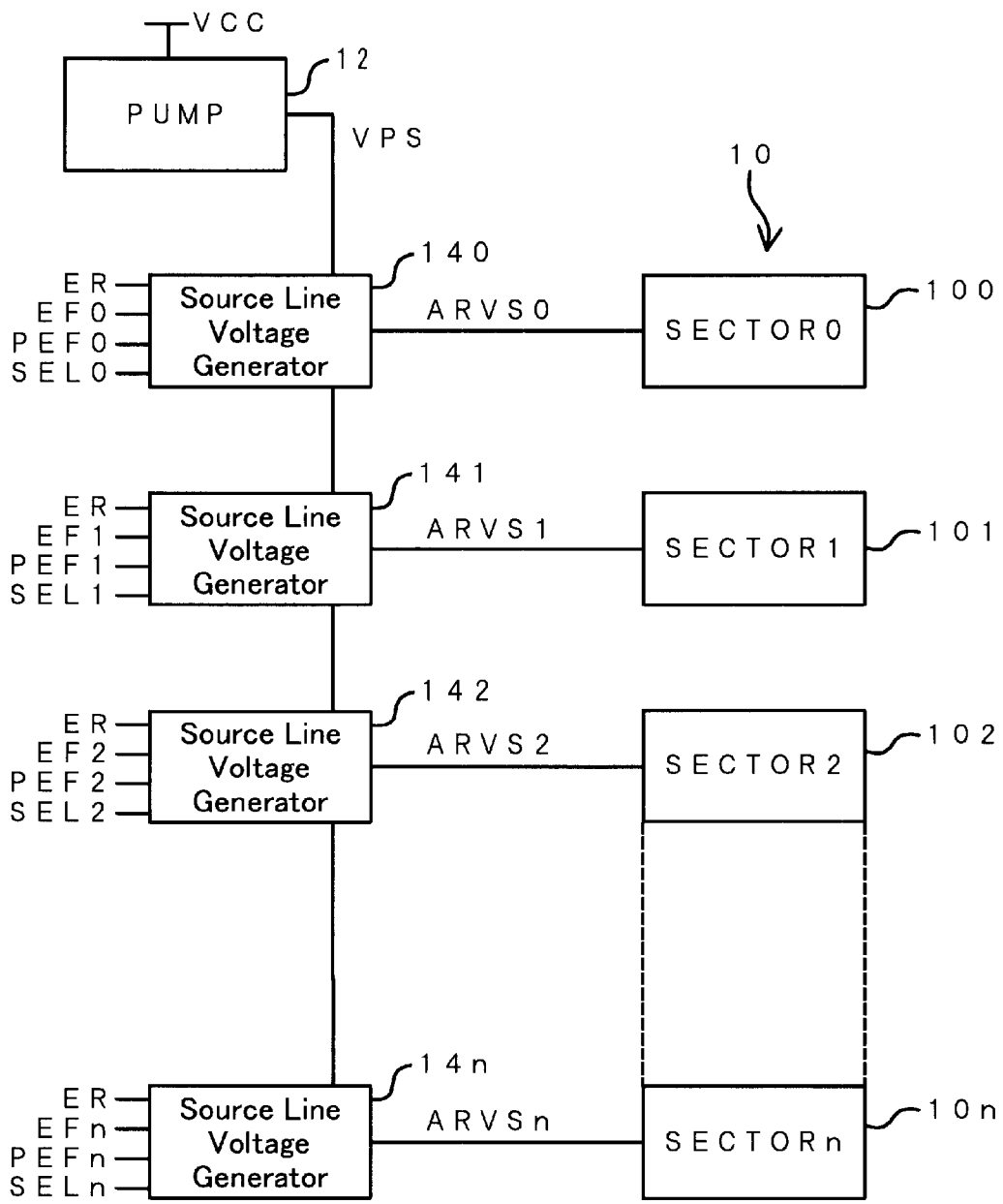
FIG. 2 is a schematic drawing of the flash memory of an embodiment of the invention.

FIG. 2 is a schematic drawing of the flash memory of an embodiment of the invention. The flash memory (non-volatile memory) shown in FIG. 2 comprises a cell array 10 having a plurality of sectors 100 to 10n. There are a plurality of memory cells having floating gates, as described later, in each sector. In addition, this flash memory comprises a step-up circuit 12 which is supplied with a power-supply voltage VCC from the outside, steps up that power-supply voltage VCC to generate an internal step-up voltage VPS.

Also, in the erasure process, there are source-line voltage generating circuits 140 to 14n for each sector that are connected to the sources for the memory cells in each sector and which generate voltages ARVS0 to ARVSn to be applied to the source line. The source-line voltage generating circuit responds to the erase-sector flag EF and pre-erase sector flag PEF that are set by a sequencer not shown in the figures, and the erase signal ER and sector selection signal SEL that are generated by the sequencer, and supplies power-supply voltage VCC, step-up voltage VPS or ground VSS to the corresponding sector as the source-line voltage.

The erase sector flag EF is a flag that indicates that the sector is to be erased, and an erase sector flag EF corresponding to one sector may be set to "1", or an erase sector flag corresponding to a plurality of sectors may be set to "1". In this embodiment, operation is for the case when a plurality of sectors are set as sectors to be erased.

The pre-erase sector flag PEF is set to "1" for sectors that are to be erased but for which the erasure process has not yet been completed. The pre-erasure process is performed for sectors that are to be erased but for which the erasure process has not yet been completed, based on this pre-erase sector flag PEF. As will be explained later, even though the erasure process has not yet been completed for a sector that is to be erased, when over erasure is detected, this pre-erase flag PEF is reset to "0" so as to stop the pre-erasure process.

The erase signal ER is a timing signal which is set to '1' while erasure stress is applied. For sectors for which the erase-sector flag EF is '1' and the selection signal SEL is also '1', the step-up voltage VPS is applied as the erasure voltage to the source or channel (well) of the cells in the sector, and erasure stress is applied to the memory cells.

The sector selection signal SEL is a signal for specifying the sector for which to perform the erasure process, and a normal sector selection signal SEL is incremented in order from sector 100 to 10n.

The source-line voltage generation circuits 140~14n comprises a sequencer described later, as well as the erasure control circuit of the embodiments of the invention. The voltages generated by the source-line voltage generation circuit are as follows:

(1) When EF=1 and SEL=1, then the step-up voltage VPS is generated while ER=1.
(2) When SEL=0 and PEF=1, the power-supply voltage VCC is generated while EF=1.
(3) In all other cases, ground VSS is generated while EF=1.

FIG. 3 is a logic table for the source-line voltage generation circuit. In the figure, case 3 corresponds to (1) above, case 2 corresponds to (2) above, and other cases correspond to (3) above, However, realistically there are no cases other than cases 2, 3 and 4. This will be made clear by the flowchart of the sequencer operation to be described later.

For the flash memory shown in FIG. 2, the erasure process is performed for one sector at a time. For example, when the sectors 100, 101 and 102 are set as sectors to be erased, their respective erase-sector flags EF0-3 are set to '1', and their pre-erase-sector flags PEF0-3 are also set to '1'. Also, the sectors are selected in order from sector 100. First, the sector selection signal is set to SEL0=1, then the step-up voltage VPS is applied to sector 100 as the source-line voltage ARVS0 while the erase signal ER=1. In this way, normal erasure stress is applied to all of the memory cells in sector 100.

At the same time as this, for the sectors 101 and 102 that are not selected, even though the pre-erase flag PEF is set to '1', the power-supply voltage VCC, which is lower than the step-up voltage VPS, is supplied to them as the source-line voltage ARVS1,2 while the erase signal ER=1. In this way, for sectors 101, 102 that are designated to be erased but for which the erasure process has not yet been performed, the pre-erasure process is performed by applying a pre-erasure stress that is weaker than the normal erasure stress, while the sector 100 is being erased.

At the instant that the erasure process for sector 100 has been completed, since a small erasure stress has been applied to sectors 101 and 102, it is possible to complete the erasure process in a short time for the sectors 101, 102. In other words, it is possible to complete the erasure process by the number of times the smaller erasure stress is applied.

Figure 4:
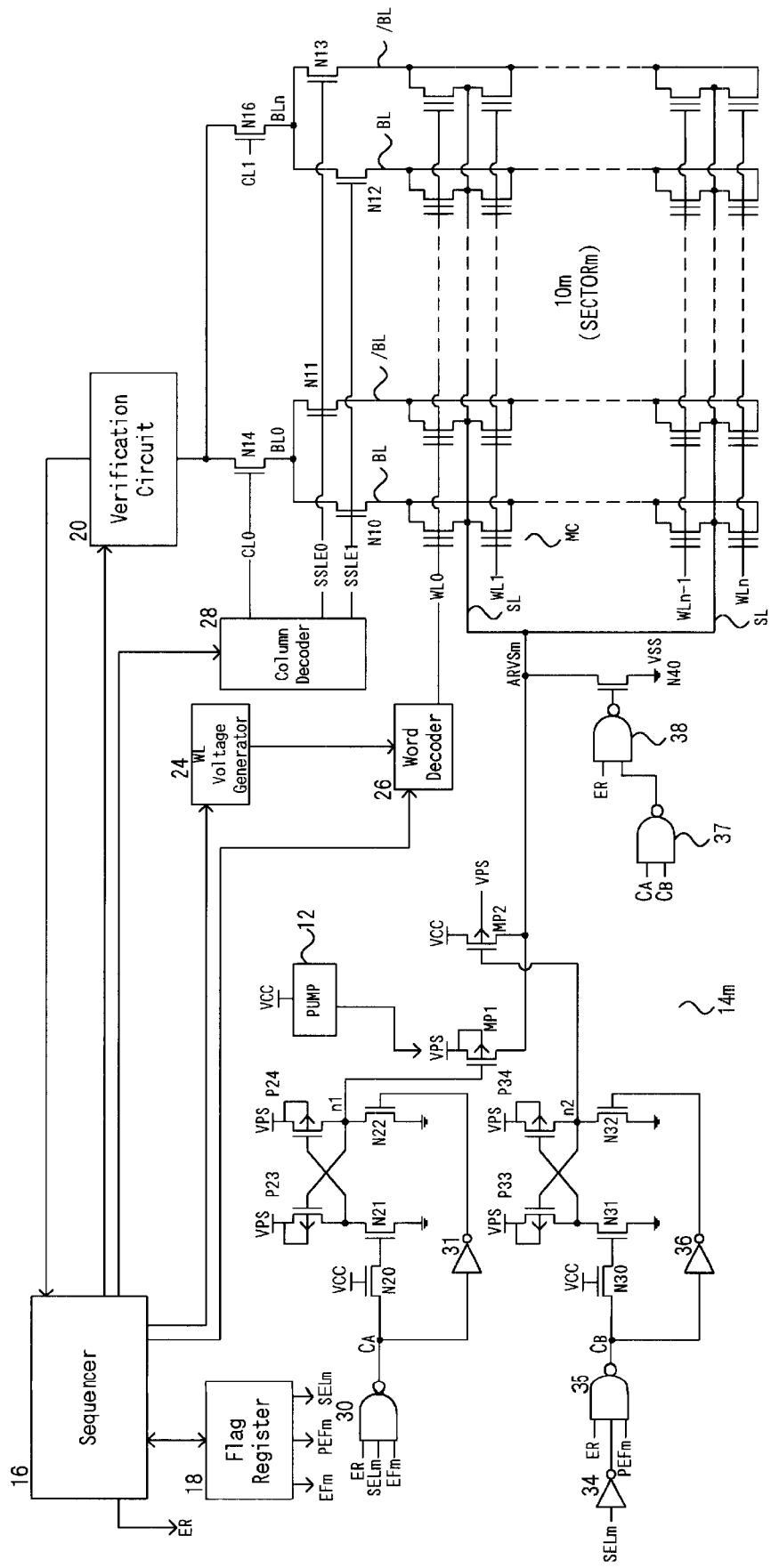
FIG. 4 is a circuit diagram of the flash memory of an embodiment of the invention.

FIG. 4 is a circuit diagram of the flash memory of this embodiment of the invention. FIG. 4 shows one sector 10m and the source-line voltage generation circuit 14m for it. Sector 10m comprises, a plurality of word lines WL0 to WLn, a plurality of source lines SL, a plurality of bit lines BL, /BL, and a plurality of memory cells MC that are located at the points where the word lines cross the bit lines. The memory cells are transistors comprising floating gates, whose control gate is connected to the word line, the drain is connected to the bit line and the source is connected to the source line. The word line is selected by a word decoder 26, and driven by a specified voltage. Also, the bit line is connected to a verification circuit 20 by way of transistor N10 to N16 that conduct according to the selection signals SSLE0, SSLE1, CL0 and CL1 that are selected by a column decoder 28. It is also connected to an output circuit which is not shown in the figure.

The sequencer 16 is a kind of microcomputer, and it controls the program, erasure and read operations for the flash memory. The sequencer 16 rewrites the flag data in the flag register 18 according to the verification results from the verification circuit 20, and it controls generation of the erase signal ER, as well as the word decoder 26, word-voltage generation circuit 24, column decoder 28 and verification circuit 20.

The source-voltage generation circuit 14m comprises power-supply transistors MP1, MP2 and N40 for supplying step-up voltage VPS, or the power-supply voltage VCC which is lower than the step up voltage, or ground voltage VSS as the source voltage ARVSn. These transistors are P-channel transistors. The transistor MP1, which supplies the step-up voltage VPS, is controlled by a circuit comprising a NAND gate 30, transistors N20, N21, N22, P23 and P24, and an inverter 31. The transistor MP2, which supplies the power-supply voltage VCC, is controlled by a circuit comprising an inverter 34, a NAND gate 35, transistors N30, N31, N32, P33 and P34, and an inverter 36. Also, the transistor N40, which supplies the ground voltage VSS, is controlled by NAND gates 37, 38.

The sector selection signal SELm, erase-sector flag EFm and erase signal ER are supplied to the NAND gate 30. In case 3 shown in FIG. 3, the output CA of the NAND gate 30 becomes L level while the erase signal ER=1. Due to this LO level, the transistor N21 becomes non-conductive, transistor N22 becomes conductive by way of the inverter 31, transistor P23 becomes conductive, transistor P24 becomes non-conductive and the node n1 becomes L level. Due to the L level of the node n1, the P-channel transistor MP1 which supplies step-up voltage VPS, becomes conductive, and outputs the step-up voltage VPS, that is generated by the step-up circuit 12, to the source line SL as source voltage ARVSm.

Moreover, an inverted signal of the sector selection signal SELm, the pre-erase-sector flag PEFm and erase signal ER are supplied to the NAND gate 35. The output CB of the NAND gate 35 becomes L level while the erase signal ER=1, for case 2 shown in FIG. 3. Due to this, the node n2 becomes L level by an operation similar to the operation described above, and the transistor MP2, that supplies the power-supply voltage, supplies the power-supply voltage VCC to the source line SL as the source voltage ARVSm.

Furthermore, when the outputs CA and CB are both H level, the output of the NAND gate 37 becomes H level, and the transistor N40 becomes conductive while the erase signal ER is '1', and it supplies the ground voltage as the source voltage ARVSm.

In the aforementioned circuit, since the power-supply voltage VCC (for example, 3V) and the step-up voltage VPS, which is larger than power-supply voltage by the threshold voltage of the transistor (for example, 5V) coexist, the step-up voltage VPS is applied to the source of the transistors P23 and P24, and the transistors P33, and P34, to control the operation of the power-supply transistors MP1 and MP2 so they conduct or do not conduct properly.

FIG. 5 is a drawing explaining the program and erasure of the flash memory. FIG. 5 shows the threshold distribution of the respective memory cell groups, where the horizontal axis is the threshold voltage and the vertical axis is the number of cells. In the figure, the program verification level PV, read reference level RD, erasure verification level EV and over-erasure verification level OEV are shown along the horizontal axis.

Figure 5A:
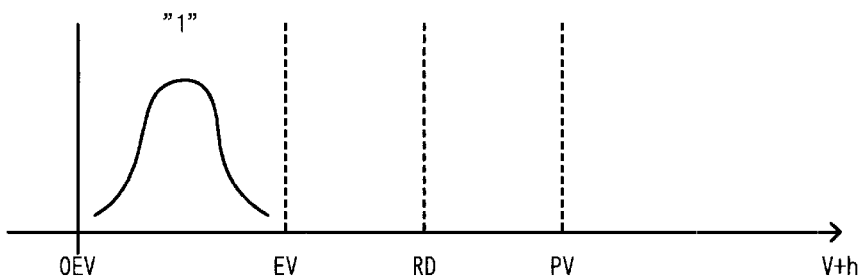
FIG. 5 is a drawing explaining the program and erasure of the flash memory.

FIG. 5A shows the threshold voltage distribution of the erasure state, and all of the threshold values are lower than the erasure verification level EV, and higher than the over-erasure verification level OEV. This state is the state for which data '1' is stored. The over-erasure verification level OEV is set to a level a little higher than 0V for example.

Figure 5B:
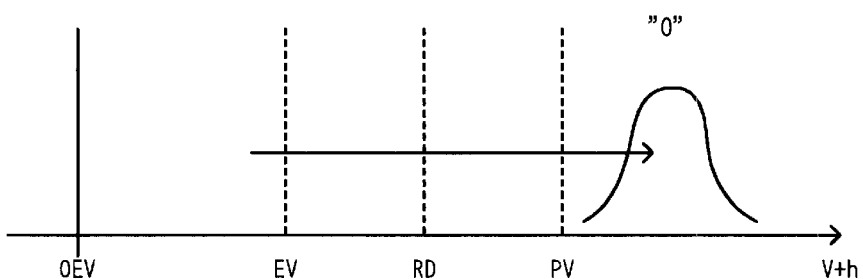

FIG. 5B shows the threshold voltage distribution of the memory cells in the program state. In the program process, by applying and ground, for example, 9V to the word line WL, 5V to the bit line BL of the memory cell to be programmed, electrons enter the floating gate from the drain side, and the threshold voltage shifts such that it becomes higher than the program verification level PV.

Figure 5C:
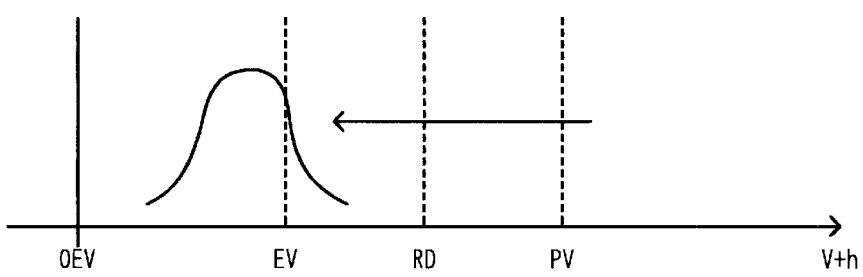

FIG. 5C shows the change in the threshold voltage distribution when the performing the erasure operation from the program state. As described above, by driving all of the word lines WL in the sector to be erased at, for example, −9V, and by opening all of the bit lines BL, /BL and applying a 5V step-up voltage erasure pulse to the source line SL, the electrons in the floating gate are drawn to the source side. The erasure pulse may be applied to the cell channel area (well area).

In the erasure process, each time when the aforementioned erasure pulse is applied, erasure verification is performed for all memory cells. In other words, whether or not the threshold voltages of the memory cell is lower than the erasure verification level EV is verified. When the threshold voltages of all the memory cells in the sector becomes lower than the erasure verification level EV, the erasure process ends.

Figure 5D:
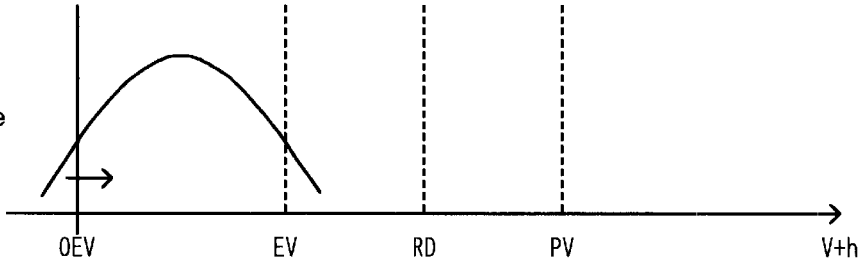

FIG. 5D shows the self-convergence operation for over erasure that occurs during the erasure process. In other words, erasure stress is applied in the same way to all of the memory cells in a sector, so there are cases of a memory cell whose threshold voltage drops to near 0V quicker than the other memory cells due to variations in characteristics of the memory cells. This memory cell fails over-erasure verification. A self-convergent process is performed for that memory cell by applying a program stress that is lighter than during programming. By this process, the threshold voltage of the memory cell becomes higher than the over-erasure verification level OEV.

The read operation is performed by applying a power-supply voltage, for example, 3V to the word line WL, and setting the bit lines BL, /BL to, for example, 0.5V and setting the source line SL to the ground voltage, and then comparing the current flowing in the bit lines with the current in the reference transistor.

Figure 6:
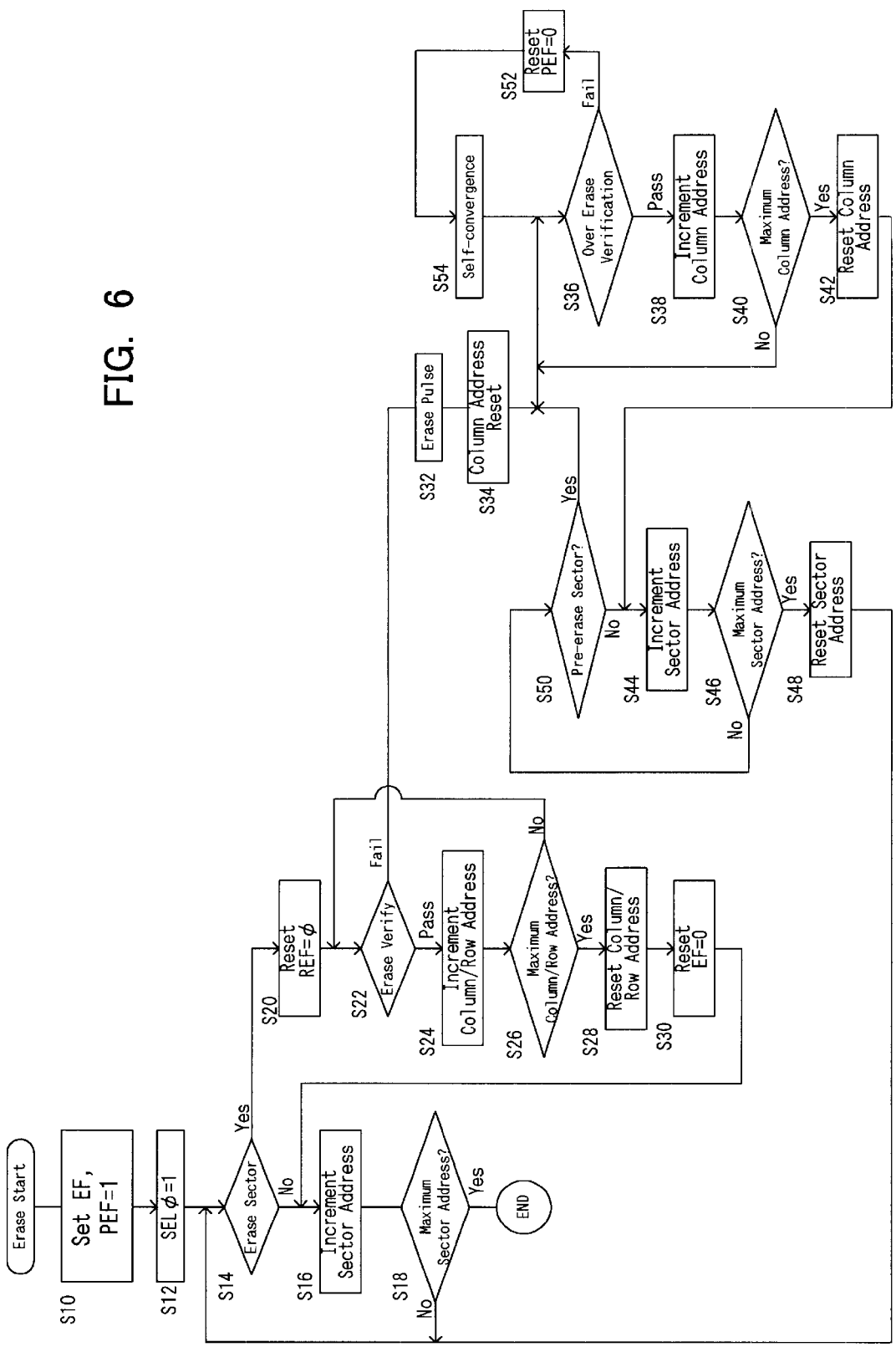
FIG. 6 is a flowchart of the erasure operation.

FIG. 6 is a flowchart of the erasure operation. The sequencer 16 performs the erasure operation according to the flowchart in FIG. 6 in response to an external erase command. The erasure operation is performed by the sequencer 16, source-voltage generation circuit 14m and verification circuit 20.

Here, the flowchart in FIG. 6 will be explained assuming that the sectors 100, 101, 102 shown in FIG. 2 are specified as sectors to be erased. Also, FIG. 7 is a table showing the changes in the erase-sector flag EF and pre-erase-sector flag PEF and the sector selection signal SEL in the flag register, for that case. In addition, all of the cells in the sectors to be erased are assumed to be in the program state.

When an erasure command specifying sectors to be erased is supplied, first, all of the erase-sector flags EF and pre-erase-sector flags PEF for the sectors to be erased are set to '1' (S10). In addition, the sector addresses are reset (S12). The sector selection signal SEL0 is set to '1' by the sector decoder 22 (state a). These flags and sector selection signal are written in the flag register 18.

The sector corresponding to the sector selection signal SEL0 is a sector to be erased (S14), so the corresponding pre-erase-sector flag PEF0 is reset to '0' (S16, state b). In addition, erasure verification is performed for the lowest-order address of the sector 100 (S22). First, erasure verification fails because it is a high threshold voltage in the program state. Then an erasure pulse is applied to all of the memory cells in the sector 100. At the same time, a pre-erasure pulse is applied to all of the memory cells in sector 101 and 102. The erasure pulse, is a step-up voltage VPS pulse, and is applied to all of the memory cells in the sector 100. The pre-erasure pulse is a lower power-supply voltage VCC pulse and is applied to all of the memory cells in the sectors 101, 102 to be erased that are not currently being erased.

When the erasure pulse is applied (S32), the column address of the sector 100 is reset (S34). Also, over-erasure verification is performed for the memory cell of the lowest-order address in the sector being erased (S36). First, the over-erased state is not set, so when this verification passes, the column address is increased by one increment (S38). This over-erasure verification process S36 is repeated until the column address is the maximum (S40). The self-convergence process is performed for memory cells in the over-erased state (S54).

When all of the memory cells in the sector being erased is not over-erasure verified, then over-erasure verification is also performed for the pre-erase sectors 101 and 102. In this embodiment of the invention, while erasure processing is being performed for one sector, pre-erasure processing is performed for the other sectors to be erased. When there are many sectors to be erased, there is a possibility that there will be many memory cells in the last sector to be erased which have been over erased. When that occurs, self-convergence processing becomes necessary, and the pre-erasure processing that was performed before that become useless. Therefore, in order to avoid this kind of unnecessary self-convergence processing, over-erasure verification is performed also for the sectors being pre-erased after the erasure process and pre-erasure processing S32.

When over-erasure verification of the sector being erased finishes, the sector address is increased by one increment (S44, state c). As a result, the sector selection signal SEL1 becomes '1', and the sector 101 becomes the sector ever-erasure processing. The pre-erase-sector flag PEF of the sector 101 is detected as being '1' in step S50, and over-erasure verification is performed in steps S36 to S42, S52 and S54. When a memory cell in the over erased state is detected by this over-erasure processing, that pre-erase-sector flag PEF is reset to '0', and pre-erasure processing is prohibited after that.

When over-erasure verification processing for the sector 101 is finished to become the state d, and over-erasure processing of the sector 102 is also finished, then the sector address is reset again (S48), and erasure processing for sector 100 continues again. In other words, operation returns to state b. After that, states b, c and d are repeated as described above.

When the process for applying the erasure pulse and pre-erasure pulse (S32) and the over-erasure verification process (S36) are repeated, soon the threshold voltage of the memory cell of the lowest-order address becomes lower than the erasure-verification level EV, and the erasure verification process S22 passes. When this happens, the column address and row address are increased by one increment, and erasure verification is performed for a memory cell of a higher order address, and erasure verification is performed for all of the memory cells in the sector being erased (S22, S24, S26). The process of applying an erasure pulse and pre-erasure pulse (S32), as well as the over-erasure verification process (S36) and erasure verification process (S22) are repeated until erasure verification has passed for all of the memory cells.

When erasure verification of all of the memory cells in sector 100 passes, that sector-erase flag EF0 is reset to '0' (S30), and the sector address is increased by one increment (S16). This sets state e. Here, in order to simplify the explanation, it is assumed that the memory cells in the sector 102 are in the over-erased state while sector 100 is being erased. As a result, in state e, the pre-erase-sector flag PEF2 for sector 102 is reset to '0'.

Next, sector 101 is identified as the sector to be erased (S14), and the erasure process is performed. Similar to the case of sector 100, that pre-erase-sector flag PEF1 is reset to '0', to become the state f. Also, at first, erasure verification is performed for the memory cell of the lowest-order address (S22). Pre-erasure processing is performed for sector 101 while sector 100 is being erased, so the threshold voltage of that memory cell shifts to a somewhat lower level.

When erasure verification fails due to insufficient erasure during pre-erasure processing, then an erasure pulse is applied to all of the memory cells in that sector 101 (S32). In that case, the pre-erase-sector flag PEF2 for the remaining sector 102 to be erased is reset to '0', so no pre-erasure pulse is applied to this sector 102. In this way, it is possible to prevent excessive over erasing.

After applying the erasure pulse, over erasure verification S36 is performed. Also, since there are no sectors whose pre-erase sector flag is '1', over-erasure verification is not performed for pre-erase sectors (S50). When all of the memory cell of sector 101 pass over-erasure verification, then erasure verification is performed (S22).

When the application of the aforementioned erasure pulse S32 is repeated, the memory cells in the sector 101 pass erasure verification (S22). Also, verification is performed until all of the memory cells in that sector pass erasure verification (S24, S26). When all of the memory cells have passed erasure verification, the erase-sector flag EF1 is reset to '0'.

Finally, in state g, erasure processing is performed for sector 102. The erasure process, over-erasure verification and erasure verification are performed as described above. After all of the memory cells have passed erasure verification, that erase-sector flag EF2 is reset to '0', and erasure processing for all sectors ends. In other words, state 'h' is set.

As described above, when erasing a plurality of sectors, at the same time that an erasure stress is applied to the memory cell of one sector, a pre-erasure stress is applied to the other sectors to be erased. When a sector's turn for erasure processing comes, the threshold voltage of the memory cell has already shifted to the erasure level, so it is possible to reduce the number of time the erasure stress must be applied for later erasure processing. The process of applying an erasure stress S32 requires the longest time of the processes shown in the process flow shown in FIG. 6, so by reducing the number of times the erasure stress is applied, it is possible to shorten the erasure time for a plurality of sectors.

It is not necessary that erasure processing be performed in unit of one sector. When the capacity of a sector is relatively small, or when the step-up circuit has an ability to supply a plenty of current, then erasure processing can be performed simultaneously for a plurality of sectors. In this case as well, pre-erasure processing is performed for the remaining sectors to be erased.

With this invention, it is possible to shorten the overall erasure time for a non-volatile memory such as a flash memory when erasing a plurality of sectors, since pre-erasure processing is performed on the remaining sectors while erasure processing is performed on part of the sectors.

The range protected by this invention is not limited by the preferred embodiments described above, but includes anything equivalent to the range of the invention disclosed in the claims.

What is claimed is:

1. A non-volatile memory that is capable of being electrically rewritten, comprising:
   a plurality of sectors each having a plurality of memory cells; and
   an erasure control circuit which, when erasing a plurality of sectors, performs an erasure process of applying a first erasure stress to said memory cells of a first sector to be erased, while at the same time performs a pre-erasure process of applying a second erasure stress, that is weaker than said first erasure stress, to said memory cells of a second sector to be erased.

2. The non-volatile memory of claim 1 wherein;
   said first erasure stress applies a first voltage to the source or channel of said memory cells, and said second erasure stress applies a second voltage, that is lower than said first voltage, to the source or channel of said memory cells.

3. The non-volatile memory of claim 1 wherein;
   said second voltage is a power-supply voltage, and said first voltage is a step-up voltage which has been stepped up from said power-supply voltage.

4. The non-volatile memory of claim 1 wherein;
   said erasure control circuit performs the erasure process in order on said second sector to be erased after erasure processing of said first sector to be erased has finished.

5. The non-volatile memory of claim 4 wherein;
   said erasure control circuit performs over-erasure verification of the memory cells in said second sector to be erased after said first and second stresses have been applied during the erasure process of said first sector to be erased; and does not perform further pre-erasure processing of said second sector to be erased when over erasure has been detected.

6. The non-volatile memory of claim 4 wherein;
   when performing the erase processing to the second sectors to be erased, at the same time said erasure processing is performed on one of the sectors of said second sectors to be erased, pre-erasure processing is performed for sectors other than that sector.

7. The non-volatile memory of claim 5 wherein;
   when erasure processing of said first sector to be erased is finished, pre-erasure processing is not performed after that for that first sector to be erased.

8. A non-volatile memory that is capable of being electrically rewritten and comprising:
   a plurality of sectors each having a plurality of memory cells; and
   an erasure control circuit which, when erasing a plurality of sectors, performs an erasure process of applying a step-up voltage pulse to the source or channel of said memory cells of a first sector to be erased, while at the same time performs a pre-erasure process of applying a power-supply voltage pulse, that is lower than said step-up voltage pulse, to the source or channel of said memory cells of a second sector to be erased.

9. The non-volatile memory of claim 8 wherein;
   said erasure control circuit, in said erasure process, applies a negative voltage to the control gates of said memory cells and makes the drains open, and in said pre-erasure process, applies said negative voltage to the control gates of said memory cells and makes the drains open.

10. The non-volatile memory of claim 8 wherein;
    said erasure control circuit performs the erasure process in order on said second sector to be erased after erasure processing of said first sector to be erased has finished.

11. The non-volatile memory of claim 10 wherein;
    said erasure control circuit performs over-erasure verification of the memory cells in said second sector to be erased after said first and second stresses have been applied during the erasure process of said first sector to be erased; and does not perform further pre-erasure processing of said second sector to be erased when over erasure has been detected.

* * * * *